United States Patent
Fukuda

(10) Patent No.: US 9,758,899 B2
(45) Date of Patent: Sep. 12, 2017

(54) MANUFACTURING METHOD OF SILICON SINGLE CRYSTAL HAVING LOW-RESISTIVITY ELECTRICAL CHARACTERISTICS

(71) Applicant: SUMCO TECHXIV CORPORATION, Nagasaki (JP)

(72) Inventor: Tomohiro Fukuda, Nagasaki (JP)

(73) Assignee: SUMCO TECHXIV CORPORATION, Nagasaki (JP)

(*) Notice: Subject to any disclaimer, the term of this patent is extended or adjusted under 35 U.S.C. 154(b) by 115 days.

(21) Appl. No.: 14/579,035

(22) Filed: Dec. 22, 2014

(65) Prior Publication Data
US 2015/0107509 A1   Apr. 23, 2015

Related U.S. Application Data

(62) Division of application No. 12/921,473, filed as application No. PCT/JP2009/054152 on Mar. 5, 2009, now abandoned.

(30) Foreign Application Priority Data

Mar. 11, 2008   (JP) ................................ 2008-061659

(51) Int. Cl.
  *C30B 15/04*   (2006.01)
  *C30B 29/06*   (2006.01)

(52) U.S. Cl.
  CPC .............. *C30B 15/04* (2013.01); *C30B 29/06* (2013.01); *Y10T 117/1032* (2015.01)

(58) Field of Classification Search
  CPC ......... C30B 15/00; C30B 15/02; C30B 15/04; C30B 15/20; C30B 29/00; C30B 29/02;
(Continued)

(56) References Cited

U.S. PATENT DOCUMENTS 5,034,200 A * 7/1991 Yamashita .............. C30B 15/12
                                                                117/19
5,827,367 A * 10/1998 Wijaranakula .......... C30B 15/00
                                                                117/200
(Continued)

FOREIGN PATENT DOCUMENTS

CN      1600905      3/2005
GB       797377      7/1958
(Continued)

OTHER PUBLICATIONS

Search report from E.P.O., dated Feb. 4, 2011, for for EP 09 71 8663.

(Continued)

*Primary Examiner* — Kenneth A Bratland, Jr.
(74) *Attorney, Agent, or Firm* — Greenblum & Bernstein, P.L.C.

(57) ABSTRACT

Disclosed is a silicon single crystal pull-up apparatus that can grow a silicon single crystal having a desired electrical resistivity, to which a sublimable dopant has been reliably added, regardless of the length of the time necessary for the formation of a first half part of a straight body part in a silicon single crystal. Also disclosed is a process for producing a silicon single crystal. The silicon single crystal pull-up apparatus pulls up a silicon single crystal from a melt by a Czochralski method. The silicon single crystal pull-up apparatus comprises a pull-up furnace, a sample chamber that is externally mounted on the pull-up furnace and houses a sublimable dopant, a shielding mechanism that thermally shields the pull-up furnace and the sample chamber, and supply means that, after the release of shielding of the shielding mechanism, supplies the sublimable dopant into the melt.

9 Claims, 2 Drawing Sheets

(58) Field of Classification Search
CPC ...... C30B 29/06; Y10T 117/00; Y10T 117/10; Y10T 117/1004; Y10T 117/1008; Y10T 117/1024; Y10T 117/1032; Y10T 117/1056
USPC ......... 117/11, 13–15, 19, 21, 200, 206, 208, 117/214, 928, 931–932
See application file for complete search history.

(56) References Cited

U.S. PATENT DOCUMENTS

| | | | |
|---|---|---|---|
| 5,876,496 A * | 3/1999 | Nagai | C30B 15/02 117/214 |
| 6,312,517 B1 | 11/2001 | Banan et al. | |
| 6,663,710 B1 * | 12/2003 | Fujita | C30B 15/00 117/13 |
| 8,518,180 B2 | 8/2013 | Narushima et al. | |
| 8,696,813 B2 | 4/2014 | Fukui et al. | |
| 2007/0056504 A1 * | 3/2007 | Lim | C30B 15/04 117/13 |
| 2008/0292523 A1 | 11/2008 | Ono et al. | |
| 2009/0064923 A1 | 3/2009 | Takanashi | |
| 2009/0293801 A1 | 12/2009 | Kuragaki | |
| 2009/0314996 A1 | 12/2009 | Kawazoe et al. | |
| 2010/0006022 A1 | 1/2010 | Kishi et al. | |
| 2010/0089308 A1 | 4/2010 | Kishi et al. | |
| 2010/0095881 A1 | 4/2010 | Fukui et al. | |
| 2010/0111802 A1 | 5/2010 | Umeno et al. | |
| 2010/0116194 A1 | 5/2010 | Togawa et al. | |
| 2010/0126407 A1 | 5/2010 | Kishi et al. | |
| 2010/0126410 A1 | 5/2010 | Fu et al. | |
| 2010/0127354 A1 | 5/2010 | Ono et al. | |
| 2010/0170432 A1 | 7/2010 | Furukawa | |
| 2010/0175611 A1 | 7/2010 | Takanashi | |
| 2010/0175612 A1 | 7/2010 | Narushima et al. | |
| 2010/0242832 A1 | 9/2010 | Takase | |
| 2010/0294999 A1 | 11/2010 | Narushima et al. | |

FOREIGN PATENT DOCUMENTS

| | | | |
|---|---|---|---|
| JP | 59-088394 | * | 5/1984 |
| JP | 59088394 | | 5/1984 |
| JP | 59-190292 | | 10/1984 |
| JP | 61-227986 | * | 10/1986 |
| JP | 09-227275 | | 9/1997 |
| JP | 2001-342094 | | 12/2001 |
| JP | 2003-532611 | | 11/2003 |
| JP | 2003-532613 | | 11/2003 |
| JP | 2005-247671 | | 9/2005 |
| JP | 2005-336020 | * | 12/2005 |
| WO | 01/86033 | | 11/2001 |
| WO | 2008/010577 | | 1/2008 |

OTHER PUBLICATIONS

U.S. official action in U.S. Appl. No. 12/597,116, dated Dec. 20, 2012.

* cited by examiner

MANUFACTURING METHOD OF SILICON SINGLE CRYSTAL HAVING LOW-RESISTIVITY ELECTRICAL CHARACTERISTICS

CROSS-REFERENCE TO RELATED APPLICATIONS

The present application is a divisional application of pending U.S. application Ser. No. 12/921,473, filed on Sep. 8, 2010, which is a National Stage of International Patent Application No. PCT/JP2009/054152, filed Mar. 5, 2009, which claims priority to Japanese Application No. 2008-061659, filed on Mar. 11, 2008, the disclosures of which are expressly incorporated by reference herein in their entireties.

TECHNICAL FIELD

The present invention relates to a silicon single crystal pulling apparatus and a manufacturing method of a silicon single crystal. More specifically, the present invention relates to a silicon single crystal pulling apparatus that pulls a doped silicon single crystal from a melt by the Czochralski method and a manufacturing method of a silicon single crystal.

BACKGROUND ART

The CZ (Czochralski) method is a crystal growth method that grows a silicon single crystal by retaining a melt in a crucible in a pulling furnace and pulling the silicon single crystal from the melt by pulling mechanism.

In order to obtain a silicon single crystal having n-type electrical characteristics, a dopant such as arsenic, red phosphorus, or antimony must be added to the silicon single crystal. As a method for adding these dopants to a silicon crystal, a method of lowering a sample chamber housing a sublimable dopant down to a predetermined position above a melt in a pulling furnace, heating and subliming a sublimable dopant by radiation heat from the melt, and introducing the sublimable dopant, which is sublimed to a gaseous form, into the melt has been adopted.

As a method for introducing the dopant in the gaseous form to the melt, a method is cited, in which an open end of a supply pipe is disposed above a melt and the dopant carried by carrier gas composed of inert gas such as argon gas is sprayed from the supply pipe toward the melt, as shown in Patent Documents 1 and 2. As another method, a method is cited in which a supply pipe is dipped in a melt and a dopant that is sublimed to a gaseous form is input into the melt through the supply pipe.

Patent Document 1 discloses an invention of pulling and growing a silicon single crystal ingot having a different specific resistance range discontinuously in a direction of growth, by: disposing a doping tube at a position not interfering with a pulling mechanism; lowering the doping tube down to a position above an upper face of a quartz crucible; melting a dopant inside a housing container by radiation heat from the melt at the position; and then lowering the housing container to a position so as to be dipped in the melt and thereby adding the melted dopant to the melt from an open surface of the doping tube.

Patent Document 2 discloses an invention of a supply pipe assembly, in which a granular dopant is input into a sealed room having an open upper end portion of a supply tube in the center thereof, the dopant is vaporized by dipping an open lower end portion of the supply pipe in a silicon melt, thereby introducing the dopant into the melt using pressure of the dopant.

[Patent Document 1]
Japanese Unexamined Patent Application Publication No. 2005-336020

[Patent Document 2]
Japanese Unexamined Patent Application (Translation of PCT Application), Publication No. 2003-532611

DISCLOSURE OF THE INVENTION

Problems to be Solved by the Invention

Here, in order to obtain a low-resistivity and high concentration silicon single crystal ingot having N++ type electrical characteristics, it is required to add an N-type dopant, such as arsenic (As), red phosphorus (P), or antimony (Sb), to the silicon single crystal in high concentration. It should be noted that an N++ type silicon single crystal is an N-type silicon single crystal having a specific resistance value lower than 0.01 Ωcm.

However, there has been a problem in that, if a dopant to be supplied to a melt is in high concentration when such an N++ type silicon single crystal is being pulled, the crystal is easily broken in a shoulder portion and below the shoulder portion of the crystal during growth from the shoulder portion to the first half of a straight body portion (a portion of approximately 100 mm in diameter). In addition, there has been a problem in that, if dislocation is to be eliminated by reducing the diameter of the crystal before formation of the shoulder portion, a neck portion must be made smaller in diameter and greater in length, since the elimination of the dislocation is difficult with a high concentration of dopant, and thus it takes a greater amount of time for growth of the crystal up to the first half of the straight body portion.

Accordingly, it is required to maintain a dopant without subliming until the first half of the straight body portion is grown, and to perform doping after growth of the first half of the straight body portion to obtain a desired electrical resistivity. However, there has been a problem in that, if the growth up to the first half of the straight body portion of the crystal takes too much time, the dopant is sublimed before formation of the first half of the straight body portion and growth of a silicon single crystal having desired electrical characteristics is difficult.

The present invention is made in view of the abovementioned situation. An objective of the present invention is to provide a silicon single crystal pulling apparatus and a manufacturing method of a silicon single crystal that can grow a silicon single crystal having a desired resistivity, to which a sublimable dopant is assuredly added, without changing the amount of time required for forming up to the first half of the straight body portion of the silicon single crystal.

Means for Solving the Problems

The present inventors have conducted an extensive study on a silicon single crystal pulling apparatus that pulls a silicon single crystal doped with a sublimable dopant in high concentration, from a melt. The present inventors found that, by providing an insulation mechanism that thermally insulates a sample chamber from a pulling furnace, radiation heat in the pulling furnace does not affect a sublimable dopant in the sample chamber, thus preventing vaporization of the sublimable dopant until insulation by the insulation mechanism is deactivated, thus leading to the completion of the present invention.

In a first aspect of the present invention, a silicon single crystal pulling apparatus that pulls a silicon single crystal from a melt by Czochralski method includes: a pulling furnace; a sample chamber that is externally attached to the pulling furnace and houses a sublimable dopant; an insulation mechanism that thermally insulates the sample chamber from the pulling furnace; and a supply means that supplies the sublimable dopant to the melt after deactivating insulation by the insulation mechanism.

According to the first aspect, by providing an insulation mechanism that thermally insulates an inside of a sample chamber from an inside of a pulling furnace, radiation heat in the pulling furnace does not affect a sublimable dopant in the sample chamber. Therefore, vaporization of the sublimable dopant is prevented until insulation by the insulation mechanism is deactivated and the sublimable dopant is supplied to the melt. As a result, a silicon single crystal having a desired resistivity, to which a sublimable dopant is assuredly added, can be grown without changing the amount of time required for forming up to a first half of a straight body portion of the silicon single crystal.

In addition, according to the first aspect, by providing the insulation mechanism, the sublimable dopant can be input by opening the sample chamber in a state in which the sample chamber is thermally insulated from the pulling furnace by the insulation mechanism such that radiation heat in the pulling furnace does not affect the sublimable dopant. Accordingly, doping can be avoided during the period from setting to input of the sublimable dopant and the period up to formation of the first half of the straight body portion of the silicon single crystal. In addition, a high-concentration sublimable dopant can be input repeatedly via the sample chamber, during growth of a straight body portion of a crystal where crystal growth is stabilized.

Furthermore, according to the first aspect, doping of a portion in which crystal growth is difficult, before formation of the first half of the straight body portion of the silicon single crystal, can be avoided. Therefore, elimination of dislocation by formation of a neck portion can be performed more easily before formation of a shoulder portion. As a result, the neck portion can be greater in diameter and bear a greater load, thereby allowing manufacture of an N++ type silicon single crystal greater in size.

Here, it is preferable that the silicon single crystal pulling apparatus is further provided with a doping tube that houses the sublimable dopant, and includes, as a supply means, a supply pipe that is connected to the doping tube and supplies a sublimable dopant that is vaporized to the melt, and a transfer means that transfers the doping tube from the sample chamber to the supply pipe. By transferring the doping tube during crystal growth, an operation of loading the doping tube to a seed axis and an operation of unloading the doping tube from the seed axis are omitted. This can reduce the time required for attaching and detaching a sublimable dopant.

According to a second aspect of the present invention, in the silicon single crystal pulling apparatus according to the first aspect, the supply means is disposed at a position not dipped in the melt and sprays the sublimable dopant that is vaporized onto the melt.

According to the second aspect, by spraying a sublimable dopant onto the melt via the supply means, vibration, decrease in temperature, and change in convection of the melt are reduced. As a result, breakage of a silicon single crystal that is grown can be reduced.

In a third aspect of the present invention, a manufacturing method of a silicon single crystal that grows a doped silicon single crystal by Czochralski method includes: thermally insulating a sample chamber that is externally attached to a pulling furnace, from the pulling furnace, by an insulation mechanism; followed by housing a sublimable dopant in the sample chamber and sealing the sample chamber; and thereafter opening up the insulation mechanism to supply the sublimable dopant to a melt.

According to the third aspect, by thermally insulating an inside of a sample chamber from an inside of a pulling furnace using an insulation mechanism, radiation heat in the pulling furnace does not affect a sublimable dopant in the sample chamber. Vaporization of the sublimable dopant can thus be prevented. As a result, a predetermined amount of a sublimable dopant can be assuredly added to the melt at a desired timing. In addition, a silicon single crystal can be grown in which a specific resistance profile radically changes at a position of a crystal doped with respect to a growing direction from a desired position on the crystal.

Furthermore, according to the third aspect, by temporarily insulating the sample chamber from the pulling furnace using the insulation mechanism, a sublimable dopant can be loaded or exchanged even during crystal growth.

Here, it is preferable that a dopant housed in the doping tube is housed in the sample chamber and, after opening up the insulation mechanism, the doping tube is transferred by the transfer means to connect to the supply pipe in the pulling furnace, thereby spraying the dopant onto the melt via the supply pipe. In such a configuration, it is not required to dispose the doping tube on the seed axis in the pulling furnace. In addition, the time required for disposing and removing the doping tube is reduced, and therefore the time required for attaching and detaching a sublimable dopant can be reduced.

According to a fourth aspect of the present invention, in the manufacturing method of a silicon single crystal according to the third aspect, a first half of a straight body portion of the silicon single crystal is grown before opening up the insulation mechanism, and a latter half of the straight body portion of the silicon single crystal is grown after opening up the insulation mechanism.

According to the fourth aspect, high-concentration addition of a sublimable dopant is prevented for a shoulder portion and a first half of a straight body portion of a crystal, thereby manufacturing a silicon single crystal in which the sublimable dopant is added in high concentration from the latter half of the straight body portion to a tail portion. Since high-concentration addition of the sublimable dopant is prevented for the shoulder portion and the first half of the straight body portion of the crystal, in which crystal growth tends to be unstable, crystal growth can be stabilized in this part and therefore manufacture of a silicon single crystal in a higher yield is realized.

According to the fifth aspect of the present invention, in the manufacturing method of a silicon single crystal according to the third or fourth aspect, the sublimable dopant is at least one selected from a group consisting of arsenic, red phosphorus, and antimony.

According to the fifth aspect, by adding at least one selected from a group consisting of arsenic, red phosphorus, and antimony, as the sublimable dopant, the sublimable dopant behaves as a donor. Accordingly, a silicon single crystal having N type electrical characteristics can be manufactured.

According to a sixth aspect of the present invention, in the manufacturing method of a silicon single crystal according to the fifth aspect, the sublimable dopant is added in high concentration.

According to the sixth aspect, by adding a sublimable dopant composed of at least one selected from a group consisting of arsenic, red phosphorus, and antimony, in high concentration, a specific resistance value of a silicon single crystal can be made lower than 0.01 Ωcm. Accordingly, an N++ type silicon single crystal can be manufactured.

In a seventh aspect of the present invention, a silicon single crystal ingot is manufactured by the manufacturing method of a silicon single crystal according to any one of the third to sixth aspects.

According to the seventh aspect, growth of a silicon single crystal is started in which a sublimable dopant is doped at a desired timing, without changing an amount of time required for forming a part from a shoulder portion to a first half of a straight body portion or pulling length of the silicon single crystal. Accordingly, a crystal state as far as the first half of the straight body portion can be assuredly improved, and a crystal state of a silicon single crystal doped with the sublimable dopant, which is grown thereafter, can also be improved.

Effects of the Invention

According to the present invention, by providing an insulation mechanism that thermally insulates the inside of a sample chamber from the inside of a pulling furnace, radiation heat in the pulling furnace does not affect a sublimable dopant in the sample chamber, thus preventing vaporization of the sublimable dopant until insulation by the insulation mechanism is deactivated. As a result, a silicon single crystal pulling apparatus and a manufacturing method of a silicon single crystal can be provided that can grow a silicon single crystal having a desired resistivity, to which a sublimable dopant is assuredly added, without changing the amount of time required for forming up to the first half of a straight body portion of the silicon single crystal.

PREFERRED MODE FOR CARRYING OUT THE INVENTION

The present invention is described in detail hereinafter.

A silicon single crystal pulling apparatus and a manufacturing method of a silicon single crystal according to the present invention are provided, the apparatus including: a pulling furnace; a sample chamber that is externally attached to the pulling furnace and houses a sublimable dopant; an insulation mechanism that thermally insulates the sample chamber from the pulling furnace; and a supply means that supplies the sublimable dopant to the melt after deactivating insulation by the insulation mechanism.

An embodiment of silicon single crystal pulling apparatus and a manufacturing method of a silicon single crystal of the present invention is described in detail hereinafter, with reference to FIGS. 1 and 2 as necessary. It is noted that the present invention is not limited to the following embodiment and can be changed as appropriate and implemented within a scope of an object of the present invention. In addition, repetitive descriptions may be omitted accordingly; however, this does not limit the spirit of the present invention.

Silicon Single Crystal Pulling Device

A first embodiment of the present invention is a silicon single crystal pulling apparatus. FIG. 1 is a cross-sectional view of a silicon single crystal pulling apparatus according to the present embodiment, and FIG. 2 is a perspective view of a main part of a silicon single crystal pulling apparatus according to the present embodiment.

Pulling Furnace

Figure 1:
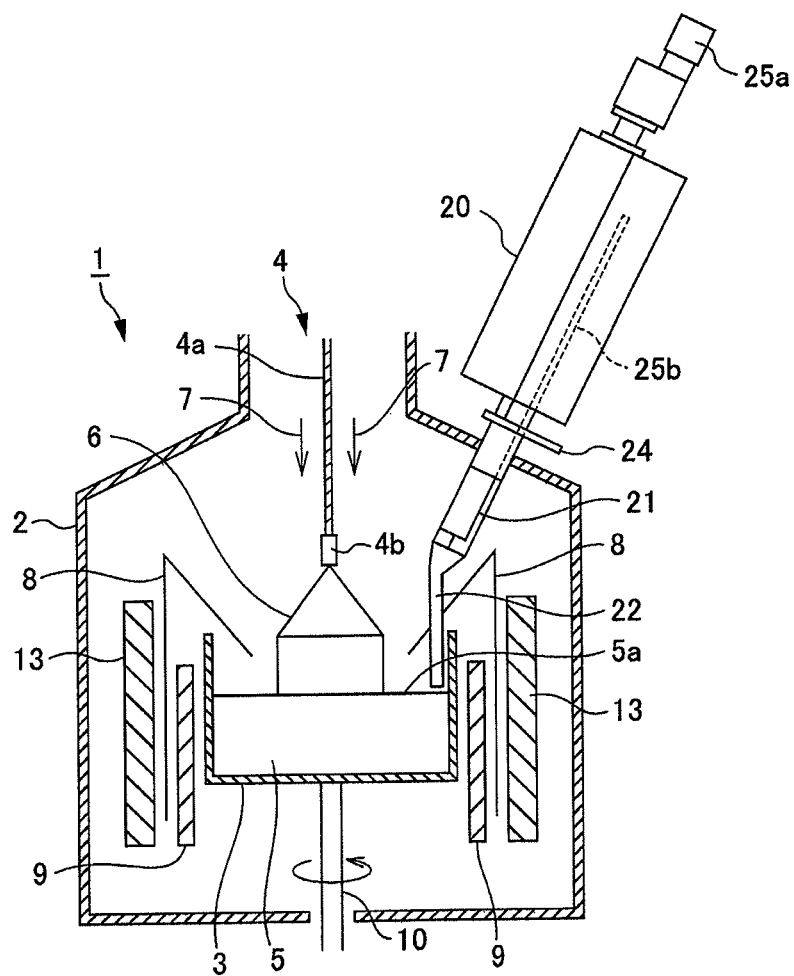
FIG. 1 is a cross-sectional view of a silicon single crystal pulling apparatus according to the present embodiment.
Figure 2:
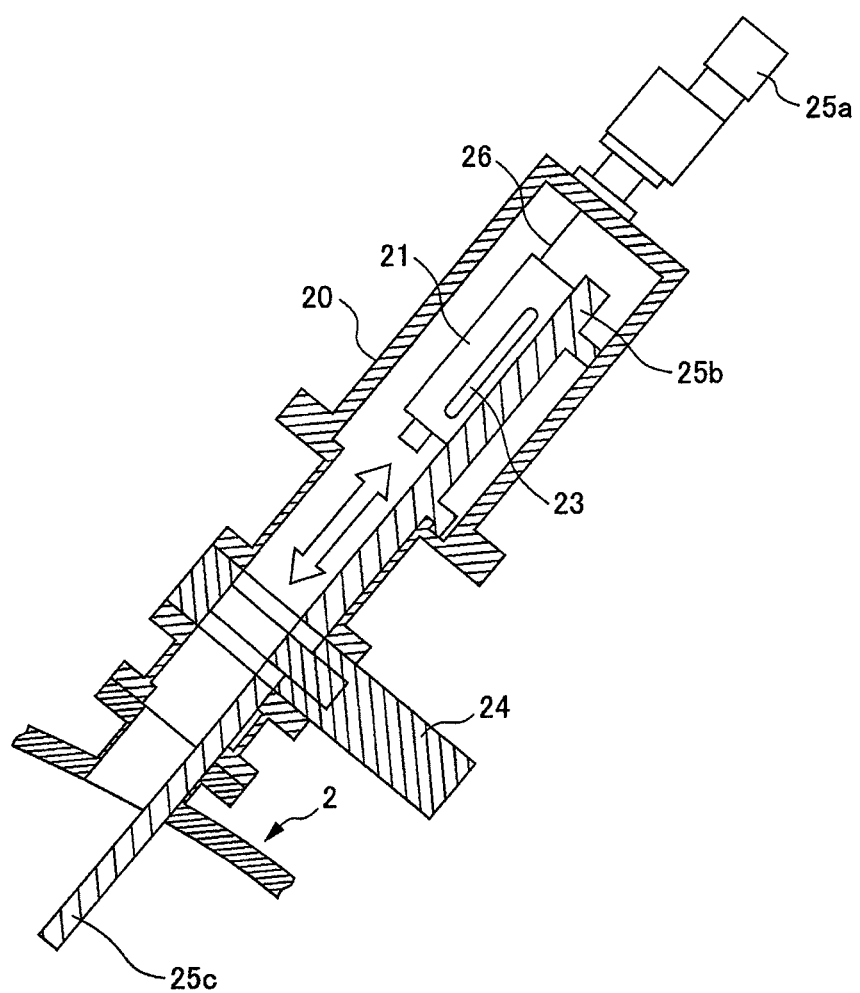
FIG. 2 is a perspective view of a main part of a silicon single crystal pulling apparatus according to the present embodiment.

As shown in FIGS. 1 and 2, the silicon single crystal pulling apparatus 1 of the present embodiment is provided with a pulling furnace (chamber) 2 that can be used for crystal growth by the CZ method.

In the pulling furnace 2, a crucible 3 is provided for housing a melt 5 that is obtained by melting a material consisting of polycrystalline silicon (Si). The crucible 3 is composed of, for example, quartz. A heater 9 for heating and melting a material inside the crucible 3 is provided around the crucible 3. Between the heater 9 and an inner wall of the pulling furnace 2, a heat-retaining tube 13 is provided.

In addition, a pulling mechanism 4 is provided above the crucible 3. The pulling mechanism 4 is composed of a pulling cable 4a and a seed crystal holder 4b that is on an end of the pulling cable 4a. The seed crystal holder 4b holds a seed crystal.

In such a configuration, a material is put in the crucible 3 and heated by the heater 9, thereby melting the material and obtaining the melt 5. When a melt state of the melt 5 is stabilized, the pulling cable 4a is lowered to dip a seed crystal held by the seed crystal holder 4b into the melt 5. After settling the seed crystal in the melt 5, the pulling cable 4a is pulled up in order to pull and grow the silicon single crystal (silicon ingot) 6 from the melt 5. When growing the silicon single crystal 6, the crucible 3 is rotated around a rotational axis 10. Meanwhile, the pulling cable 4a of the pulling mechanism 4 is rotated in the same direction as, or a different direction from, a rotational direction of the rotational axis 10. Here, the rotational axis 10 can be driven also in a perpendicular direction and can move the crucible 3 up and down to an arbitrary upper position.

At this time, the inside of the pulling furnace 2 is decompressed to a vacuum state (for example, tens of Torr) by shutting down outside air. In addition, argon gas 7 is supplied as inert gas to the inside of the pulling furnace 2 and discharged from the inside of the pulling furnace 2 using a pump. By circulating the argon gas 7 inside the pulling furnace 2, vaporized material generated inside the pulling furnace 2 can be taken away to the outside of the pulling furnace 2 along with the argon gas 7. A feed rate of the argon gas 7 can be set for each step in the crystal growth.

As the silicon single crystal 6 grows, contact area between the melt 5 and the crucible 3 changes due to decrease of the melt 5, and the amount of dissolution of oxygen from the crucible 3 changes. Accordingly, a concentration distribution of oxygen in the silicon single crystal 6 that is to be pulled is affected by the decrease of the melt 5. Given this, a thermal insulation plate 8 (gas rectifier tube) is provided above the crucible 3 and around the silicon single crystal 6. The thermal insulation plate 8 guides the argon gas 7 that is supplied from an upper side of the pulling furnace 2 to a center of a melt surface 5a, and further to an outer peripheral portion of the melt surface 5a via the melt surface 5a. As a result, the argon gas 7 is discharged from an outlet provided in a lower side of the pulling furnace 2 along with a vaporized material from the melt 5. This can stabilize gas flow rate on the liquid surface and maintain oxygen evaporating from the melt 5 in a stable state.

In addition, the heat insulation plate 8 has a function of insulating radiation heat to the seed crystal and the growing silicon single crystal 6, generated in a high-temperature part, such as the crucible 3, the melt 5, the heater 9, or the like. Furthermore, the heat insulation plate 8 also has a function of avoiding inhibition of single crystal growth due to impurity (for example, silicon oxide) and the like, which is generated inside the pulling furnace 2, attached to the silicon single crystal 6. Here, a distance D between a lower end of the heat insulation plate 8 and the melt surface 5a can be adjusted either by up and down movement of the crucible 3 or by up and down movement of the heat insulation plate 8 by an elevation device.

Sample Chamber

The sample chamber 20 contains a sublimable dopant 23 (impurity) that dopes the silicon single crystal 6 to be grown. The sample chamber 20 is externally attached to a flange portion of the pulling furnace 2 via an insulation mechanism 24 to be described later. Here, as the sublimable dopant 23 to be stored in the sample chamber 20, N-type sublimable dopants for providing the silicon single crystal with N-type electrical characteristics are cited, such as arsenic (As), red phosphorus (P), or antimony (Sb). Particularly, arsenic (As) and red phosphorous (P) are sublimable dopants and can be sublimed from a solid phase to a vapor phase at a relatively low temperature when used as the sublimable dopant 23.

When housing the sublimable dopant 23 in the sample chamber 20, it is preferable that the sublimable dopant 23 is put into the doping tube 21 and the doping tube 21 is housed in the sample chamber 20. By using the doping tube 21, the sublimable dopant 23 can be easily loaded into and unloaded from the sample chamber 20 and can be assuredly input into the pulling furnace 2 that is in operation. Here, a material that can resist high temperatures due to melt radiation heat, specifically quartz, can be used as a material for the doping tube 21.

A vacuum pump and an argon gas line are preferably provided to the sample chamber 20. By providing the vacuum pump and the argon gas line, pressure inside the sample chamber 20 is reduced or restored to ordinary pressure, independently from the pulling furnace 2. As a result, a rapid change in pressure inside the sample chamber 20 can be reduced when a gate valve is opened or the doping tube 21 is removed.

In addition, it is preferable to provide the sample chamber 20 with a cooling mechanism. By providing the cooling mechanism, the doping tube 21 heated in the pulling furnace 2 is efficiently cooled by combined use of the cooling mechanism and the argon gas. As a result, the doping tube 21 can be exchanged more smoothly.

In addition to the insulation mechanism 24, a tube having flanges at both ends thereof can be interposed between the sample chamber 20 and the pulling furnace 2. In this case, the tube can be provided with a cooling mechanism as with the sample chamber 20, or with a small window. Particularly, by providing the tube with the small window, input of the sublimable dopant 23 can be easily confirmed.

Insulation Mechanism

The insulation mechanism 24 that thermally insulates the sample chamber 20 from the pulling furnace 2 is provided between the pulling furnace 2 and the sample chamber 20. By providing the insulation mechanism 24, radiation heat and atmosphere inside the pulling furnace 2 are thermally blocked by the insulation mechanism 24 and a desired amount of the sublimable dopant 23 can be sublimed at a desired timing. For example, the insulation mechanism 24 can be opened during crystal growth to input the sublimable dopant 23 from the sample chamber 20.

A sliding gate valve can be preferably used as the insulation mechanism 24. By using the sliding gate valve, space of the insulation mechanism 24 in a stroke direction is reduced and therefore a transfer distance of the sublimable dopant 23 from the sample chamber 20 can be reduced. In this case, it is more preferable to use a cooling mechanism also in the insulation mechanism 24. By using the cooling mechanism, the insulation mechanism 24 is not deteriorated by heat from the pulling furnace 2, and the sample chamber 20 can be assuredly thermally insulated from the pulling surface 2.

When the insulation mechanism 24 is closed, radiation heat of the inside of the pulling furnace 2 does not reach the sublimable dopant 23 inside the sample chamber 20 and does not vaporize the sublimable dopant 23. As a result, during a period after the beginning of growth of the silicon single crystal 6 and before first opening of the insulation mechanism 24, the silicon single crystal 6 being grown can be maintained additive-free, without the sublimable dopant 23.

Thereafter, the insulation mechanism 24 is opened when doping of the silicon single crystal 6 with the sublimable dopant 23 is started, in other words when the shoulder portion and a first half of the straight body portion of the silicon single crystal 6 have grown. Here, when the insulation mechanism 24 is being opened, the sublimable dopant 23 is stored at a predetermined position in the sample chamber 20, a door of the sample chamber 20 is closed, and a pressure inside the pulling furnace 2 and a pressure inside the sample chamber 20 are adjusted by operating a vacuum pump on the sample chamber 20 side. By opening the insulation mechanism 24 to perform doping with the N-type sublimable dopant 23 in high concentration when a shoulder portion to a first half of the straight body portion of the silicon single crystal 6 is grown, the silicon single crystal 6 of low resistivity can be manufactured that has N++ type electrical characteristics, in which a part from the shoulder portion to the first half of the straight body portion is free of the sublimable dopant 23 and a part from a second half of the straight body portion to a tail portion is doped with the sublimable dopant 23 in high concentration.

When the N++ type silicon single crystal 6 of low resistivity is pulled and grown by adding the sublimable dopant 23 to the silicon single crystal in high concentration, breakage of crystal is likely to occur. However, according to the present embodiment, by using the insulation mechanism 24, timing for input of the sublimable dopant 23, which provides N-type electrical characteristics to the silicon single crystal 6, can be precisely controlled. As a result, even if growth up to the first half of the straight body portion of the silicon single crystal 6 takes an extended amount of time, breakage of crystal can be reduced.

The insulation mechanism 24 can be closed not only after growth of the silicon single crystal 6, but also after input of all the sublimable dopant 23 even during crystal growth. After closing the insulation mechanism 24, the pressure inside the sample chamber 20 is restored to atmospheric pressure by introducing the argon gas 7 into the sample chamber 20, and then the sublimable dopant 23 can be repeatedly input by opening the door of the sample chamber 20.

Supply Means

The supply means is a means for supplying the sublimable dopant 23 to the melt 5 after deactivating thermal insulation between the pulling furnace and the sample chamber 20 by the insulation mechanism 24. As the supply means, a means including the following transfer means 25 and supply tube 22 may be cited.

Transfer Means

A transfer means 25 transfers the doping tube 21 connectively to a supply tube 22 (described later), and is composed of, for example, a wire elevation/descent unit 25a and elevation/descent rails 25b and 25c.

The wire elevation/descent unit 25a is a mechanism to move the doping tube 21 up and down by a wire 26, and drives a winding drum by a motor and adjusts height of the doping tube 21 via the wire. Here, driving of the motor by the wire elevation/descent unit 25a is preferably controlled by a height position of the doping tube 21 and an open/close state of the insulation mechanism 24.

In addition, the elevation/descent rails 25b and 25c are provided between the inside of the sample chamber 20 and the supply tube 22 and define a position at which the doping tube 21 moves up and down. By providing the elevation/descent rails 25b and 25c, the doping tube 21 can be connected to the supply tube 22 more firmly, and the sublimable dopant 23 can be transferred to the supply tube 22 more assuredly. The elevation/descent rails 25b and 25c are preferably composed of a graphite material. By the elevation/descent rails 25b and 25c being composed of a graphite material, the elevation/descent rails 25b and 25c can be highly heat-resistant and restriction to shape thereof can be reduced.

As shown in FIG. 1, the transfer means 25 is disposed at a position not interfering with the silicon single crystal 6 and the pulling mechanism 4 and not being immersed in the melt 5. By disposing the transfer means 25 at the position not interfering the pulling mechanism 4, the sublimable dopant 23 can be input while pulling the silicon single crystal 6.

Here, when the insulation mechanism 24 is opened, the doping tube 21 housing the sublimable dopant 23 goes down along the elevation/descent rails 25b and 25c by drive of the wire elevation/descent unit 25a. As a result, a tip of the doping tube 21 is connected to the supply pipe 22.

Supply Pipe

The supply pipe 22 is connected to the doping tube 21 that is transferred by the transfer means 25 and guides the sublimable dopant 23, which is vaporized by radiation heat from the melt and the like, to the melt 5.

As shown in FIG. 1, the supply pipe 22 is disposed at a position not interfering the silicon single crystal 6 and the pulling mechanism 4, and not being immersed in the melt 5. By disposing the supply pipe 22 at the position not interfering the pulling mechanism 4, the sublimable dopant 23 that is vaporized can be guided to the melt 5 while pulling the silicon single crystal 6, thereby allowing a highly accurate doping during pulling of the crystal. In addition, by disposing the supply pipe 22 at the position at which it is not immersed in the melt 5 and spraying the vaporized sublimable dopant 23 from the supply pipe 22 onto the melt 5, vibration, decrease in temperature, and change in convection of the melt 5 due to immersing the supply pipe 22, the sublimable dopant 23 and the like into the melt 5, can be reduced. By stabilizing crystallization rate of a single crystal that is being grown, an adverse effect on a crystal state of the silicon single crystal 6 that is grown can be reduced. Here, the supply pipe 22 is preferably disposed at a position such that input efficiency of the sublimable dopant 23 into the melt 5 is maximized when the sublimable dopant 23 is sprayed onto the melt 5.

Any material that can resist high temperatures due to radiation heat from the melt and the like, specifically quartz, can be used as a material for the supply pipe 22.

It is noted that, although the sublimable dopant 23 is supplied to the melt 5 by a spraying method, an immersion method that immerses the supply pipe 22 in the melt 5 can also be used for supplying the sublimable dopant 23 to the melt 5.

Other Modes

In the silicon single crystal pulling apparatus of the present embodiment, a carrier gas introduction pipe (not shown) can also be used as necessary. The carrier gas introduction pipe communicates with the doping tube 21 and introduces carrier gas that is supplied from a gas supply source (not shown) for transferring a dopant into the doping tube 21. By introducing the carrier gas, the sublimable dopant 23 that is vaporized can be efficiently guided to the melt 5 via the supply pipe 22 without retention in the doping tube 21. The carrier gas introduction pipe is composed of, for example, quartz. An inert gas such as argon gas is used as the carrier gas.

What is claimed is:

1. A manufacturing method of a silicon single crystal that grows a doped silicon single crystal by the Czochralski method that pulls the silicon single crystal from a melt, by using a silicon single crystal pulling apparatus including:
a pulling furnace including a supply tube for introducing a sublimable dopant to be vaporized into the melt;
a sample chamber that is externally attached to the pulling furnace and houses a slidable doping tube that can house a sublimable dopant;
a sliding path for the doping tube, provided between an inside of the sample chamber and the supply tube; and
an insulative sliding gate valve that thermally insulates the sample chamber from the pulling furnace, the sliding gate valve being configured to slidably enter and exit so as to be orthogonal to the sliding path, the manufacturing method comprising:
thermally insulating the sample chamber from the pulling furnace by way of the sliding gate valve;
housing the sublimable dopant in the doping tube of the sample chamber, and sealing the sample chamber; and
after a first half of a straight body portion of the silicon single crystal has grown, slidably opening the sliding gate valve, sliding the doping tube towards the melt of the pulling furnace via the sliding path so as to connect the doping tube to the supply tube, and supplying the sublimable dopant to the melt via the supply tube, wherein:
the first half of the straight body portion of the fully grown crystal is not doped with the sublimable dopant; and
a second half of the straight body portion and a tail portion of the fully grown silicon single crystal are doped with the sublimable dopant and have a specific resistance value lower than 0.01 Ωcm.

2. The manufacturing method of a silicon single crystal according to claim 1,
wherein the sublimable dopant is at least one selected from the group consisting of arsenic, red phosphorus, and antimony.

3. The manufacturing method of a silicon single crystal according to claim 2, wherein:
the apparatus further includes a vacuum pump, an argon gas line and a cooler provided in the sample chamber,
when the sliding gate valve is closed, pressure inside the sample chamber is reduceable or restorable to ordinary pressure, independent from the pulling furnace, by operating the vacuum pump, and
the method further comprises cooling the doping tube heated by combined use of the cooler and argon gas of the argon gas line in the sample chamber.

4. A manufacturing method of a silicon single crystal that grows a doped silicon single crystal by the Czochralski method that pulls the silicon single crystal from a melt, by using a silicon single crystal pulling apparatus including:
a pulling furnace including a supply tube for introducing a sublimable dopant to be vaporized into the melt, the pulling furnace disposed at a position not dipped in the melt;
a sample chamber that is externally attached to the pulling furnace and houses a slidable doping tube that can house a sublimable dopant;
an elevation/descent rail as a sliding path for the doping tube, provided between an inside of the sample chamber and the supply tube;
a wire elevation/descent unit including a winding drum with a motor, the wire elevation/descent unit moving the doping tube of the elevation/descent rail up and down, and adjusting a height position of the doping tube via a wire; and
an insulative sliding gate valve that thermally insulates the sample chamber from the pulling furnace, the sliding gate valve being configured to slidably enter and exit so as to be orthogonal to the sliding path of the elevation/descent rail, the manufacturing method comprising:
thermally insulating the sample chamber from the pulling furnace by way of the sliding gate valve;
housing the sublimable dopant in the doping tube of the sample chamber and sealing the sample chamber;
controlling driving of the motor of the wire elevation/descent unit by way of a height position of the doping tube and an open/close state of the insulative sliding gate valve;
at a timing when a shoulder portion and a first half of a straight body portion of the silicon single crystal has grown, slidably opening the sliding gate valve, sliding the doping tube toward the melt of the pulling furnace via the elevation/descent rail so as to connect the doping tube to the supply tube, and supplying the sublimable dopant to the melt via the supply tube,
wherein:
the first half of the straight body portion of the fully grown crystal is not doped with the sublimable dopant; and
a second half of the straight body portion and a tail portion of the fully grown silicon single crystal are doped with the sublimable dopant and have a specific resistance value lower than 0.01 Ωcm.

5. The manufacturing method of a silicon single crystal according to claim 4,
wherein a vacuum pump and an argon gas line are provided to the sample chamber, and pressure inside the sample chamber can be reduced or restored to ordinary pressure, independently from the pulling furnace.

6. The manufacturing method of a silicon single crystal according to claim 5,
wherein when the sliding gate valve is sliding opened, the sublimable dopant is stored at a predetermined position in the sample chamber, a door of the sample chamber is closed, and a pressure inside the pulling furnace and a pressure inside the sample chamber are adjusted by operating the vacuum pump on the sample chamber side.

7. The manufacturing method of a silicon single crystal according to claim 5, further comprising:
providing a cooler in the sample chamber, and
cooling the doping tube heated in the pulling furnace by combined use of the cooler and an argon gas of the argon gas line.

8. The manufacturing method of a silicon single crystal according to claim 7, further comprising cooling the sliding gate valve by the cooler.

9. The manufacturing method of a silicon single crystal according to claim 6,
further comprising closing the sliding gate valve after growth of the silicon single crystal or after input of all the sublimable dopant even during crystal growth;
once the sliding gate valve is closed, restoring pressure inside the sample chamber to atmospheric pressure by introducing the argon gas into the sample chamber; and
opening the door of the sample chamber and supplying the sublimable dopant by way of the doping tube.

* * * * *